United States Patent
Hijzen et al.

(10) Patent No.: US 7,199,010 B2
(45) Date of Patent: Apr. 3, 2007

(54) METHOD OF MAUFACTURING A TRENCH-GATE SEMICONDUCTOR DEVICE

(75) Inventors: Erwin A. Hijzen, Blanden (BE); Raymond J. E. Hueting, Helmond (NL); Michael A. A. In't Zandt, Veldhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/538,212

(22) PCT Filed: Dec. 8, 2003

(86) PCT No.: PCT/IB03/06014

§ 371 (c)(1), (2), (4) Date: Jun. 9, 2005

(87) PCT Pub. No.: WO2004/055882

PCT Pub. Date: Jul. 1, 2004

(65) Prior Publication Data

US 2006/0017097 A1   Jan. 26, 2006

(30) Foreign Application Priority Data

Dec. 14, 2002  (GB) ................. 0229210.0

(51) Int. Cl.
  *H01L 21/336*  (2006.01)
  *H01L 21/3205*  (2006.01)
  *H01L 29/76*  (2006.01)

(52) U.S. Cl. ............... 438/270; 438/589; 257/213; 257/E27.91

(58) Field of Classification Search .......... 438/270, 438/589, 981
See application file for complete search history.

(56) References Cited

U.S. PATENT DOCUMENTS

| 6,326,261 B1 * | 12/2001 | Tsang et al. ........... 438/243 |
| 6,331,467 B1   | 12/2001 | Brown et al. |
| 6,444,528 B1 * | 9/2002  | Murphy ............... 438/270 |
| 6,709,912 B1 * | 3/2004  | Ang et al. ............. 438/199 |

FOREIGN PATENT DOCUMENTS

| EP | 0801426 A2 | 10/1997 |
| EP | 0801426 A3 | 10/1997 |
| FR | 0801426 A2 * | 10/1997 |
| WO | WO0072372 A1 | 11/2000 |

* cited by examiner

*Primary Examiner*—Scott B. Geyer
*Assistant Examiner*—Elias Ullah
(74) *Attorney, Agent, or Firm*—Peter Zawilski

(57) ABSTRACT

A method of making a trench MOSFET includes forming a nitride liner 50 on the sidewalls 28 of a trench and a plug of doped polysilicon 26 at the bottom of a trench. The plug of polysilicon 26 may then be oxidised to form a thick oxide plug 30 at the bottom of the trench whilst the nitride liner 50 protects the sidewalls 28 from oxidation. This forms a thick oxide plug at the bottom of the trench thereby reducing capacitance between gate and drain.

10 Claims, 2 Drawing Sheets

METHOD OF MAUFACTURING A TRENCH-GATE SEMICONDUCTOR DEVICE

The invention relates to the method of manufacture of a semiconductor device incorporating a trench, particularly a trench MOSFET (metal oxide semiconductor field effect transistor).

Figure 2:
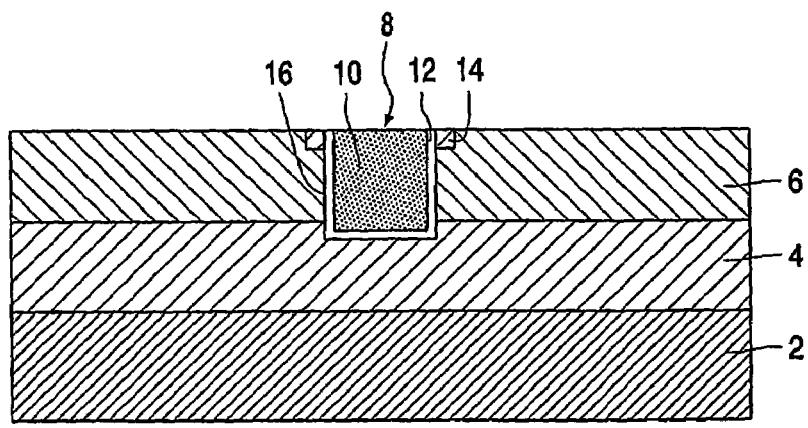

An example of a prior art trench semiconductor structure is illustrated in FIG. 2. An n-type drain layer 4 is provided over an n+ substrate 2, and a p-type body layer 6 is provided on the drain layer 4. A trench 8 extends through the body layer 6 as far as the drain layer 4, and includes a conductive gate 10 insulated from the body layer by a gate insulator 12. N+ source diffusions 14 are provided adjacent to the trench.

In use, a voltage is applied to the gate electrode to control a channel 16 extending in the body layer 6 adjacent to the trench 8 between the source 14 and drain 4.

Further details of prior art trench structures are provided in U.S. Pat. No. 6,331,467 to Brown et al, assigned to the US Philips Corporation and incorporated herein by reference.

A problem with this structure is the capacitance between the gate and drain, since the gate at the bottom of the trench is very close to the drain. This capacitance can give rise to problems, and in particular to the Miller effect. The capacitance should therefore be minimised.

A known approach to reducing this capacitance is described in U.S. Pat. No. 6,444,528 to Murphy, which suggests providing a thicker insulator at the bottom of the trench. U.S. Pat. No. 6,444,528 describes forming a second trench at the bottom of the trench and growing selective oxide in the second trench to form this thicker insulator.

However, this approach is complex to manufacture and there is accordingly a need for a simpler approach to manufacturing such structures.

According to the invention there is provided a method of manufacturing a trench gate semiconductor device comprising the steps of: providing a silicon device body having a first major surface, the silicon device body having a drain region of a first conductivity type and a body region over the drain region; forming a trench extending downwards into the silicon device body from the first major surface, the trench having sidewalls and a base; depositing a nitride liner within the trench to protect the sidewalls; forming a polysilicon plug at the base of the trench; thermally oxidising the device to oxidise the polysilicon at the bottom of the trench to form an oxide plug at the base of the trench; and depositing conductive material within the trench to form a gate.

The thick oxide region or plug at the base of the trench can greatly reduce the gate-drain capacitance and hence the Miller effect of the finished device. The approach according to the invention is relatively straightforward to manufacture.

The nitride liner ensures that there is essentially no oxidation of the side walls. In contrast, a layer of oxide is not generally capable of preventing oxidation—the oxide layer can simply become thicker. Polymer or polyimide are worse, since these are not generally compatible with the oxidation processes used to oxidise polysilicon and they may even burn under oxidising conditions.

The lack of oxidation of the sidewalls ensures that the trench does not need to be any wider than the minimum necessary to provide room for the oxidised sidewalls at this stage of the process. Thus, the trench can be narrower than would be the case if an oxide liner was used instead of the nitride.

In embodiments, the polysilicon formed at the base of the trench is doped. By forming doped polysilicon in the bottom of the trench and then oxidising it a thick region at the bottom of the trench can readily be formed. Doped polysilicon is relatively straightforward to oxidise.

The polysilicon may be formed doped, or alternatively the polysilicon may doped after being deposited, for example by diffusion from a suitable source such as a $POCl_3$ source.

The step of depositing polysilicon at the base of the trench may include depositing polysilicon over the first major surface including the trench and then etching back the polysilicon to remove the polysilicon from the first major surface leaving the polysilicon at the base of the trench.

In embodiments, the method additionally includes the step of thermally oxidising the side wall of the trench to form an oxide before depositing the nitride liner and the step of etching away the nitride liner to expose the gate oxide before depositing conductive material within the trench to form a gate.

Alternatively, the gate oxide may be formed after the step of forming the oxide plug. In a less preferred approach, the nitride liner may form the gate oxide.

The oxidation step used to oxidise the polysilicon may be low temperature wet oxidation, at a temperature range of 650° C. to 850° C., preferably 700° C. to 800° C. This low temperature process minimises the stress to the structure during manufacture. Indeed, a particular benefit of using doped polysilicon is that it is readily oxidised by such a process.

Following the step or steps of forming the oxide at the bottom of the trench and the gate oxide the trench may be filled with doped polysilicon to form a gate.

In another aspect, there is provided a trench MOSFET comprising: a drain region of first conductivity type; a body region over the drain region; a trench extending from a first major surface through the body region; source regions laterally adjacent to the trench at the first major surface; thermal gate oxide on the side walls of the trench; a gate electrode in the trench insulated from the body region by the gate oxide; characterised by a thick oxide plug formed of oxidised doped polysilicon at the base of the trench extending into the drain region.

As explained above, such a structure is relatively straightforward to manufacture and exhibits a reduced Miller effect.

For a better understanding of the invention, embodiments will now be described, purely by way of example with reference to the accompanying drawings in which:

FIGS. 1a to 1e show successive steps in a method of manufacturing a semiconductor device according to a first embodiment the invention; and FIG. 2 shows a prior art method of manufacturing a semiconductor device.

The diagrams are purely schematic and not to scale.

Figure 1A:
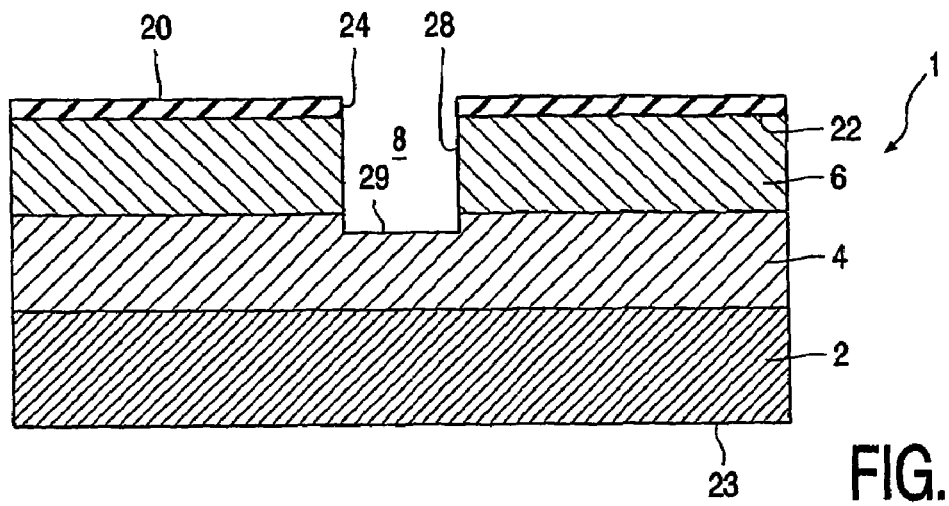
Figure 1B:
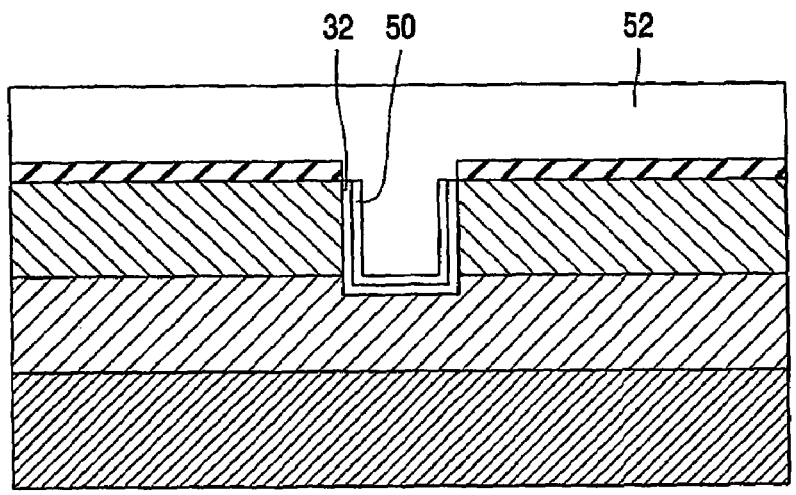
Figure 1C:
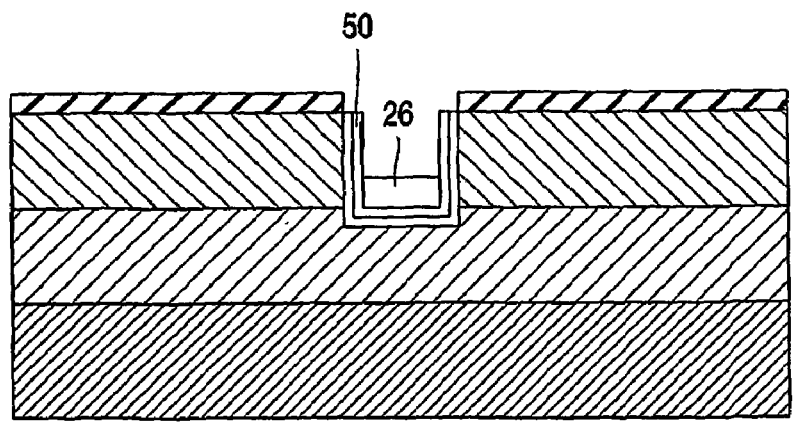

Referring to FIG. 1a, an n-type epilayer 4 is grown on an n+ type semiconductor substrate 2. A low doped p-body layer 6 is then formed on the epilayer 4, for example by ion implantation. Alternatively, the ion implantation step to form layer 6 may be carried out after the formation of the trench, or the is layer 6 may also be grown epitaxially. This structure will be known as the "silicon device body" 1 in the following—the term is not intended to refer to just the body layer 6. The silicon device body 1 has opposed first 22 and second 23 major surfaces.

It should be noted that where spatial terms such as "on", "over" and "downwards" are used in the present specification, these are intended to be relative to the device, and do not imply any particular orientation of the device in space.

Hard mask 20 is then formed by depositing oxide layer 20 on the first major surface 22 of the silicon device body 1 and patterning the oxide layer 20 to have an opening 24. Trench 8 is then etched through the opening into the n-layer 4. This trench etch may be carried out by any known process. The trench has sidewalls 28 and a base 29, as shown in FIG. 1a.

A thermal oxidation process is then carried out to form thermal oxide 32 on the sidewalls 28 and base 29 of the trench.

Next, a dielectric liner 50 of nitride is deposited on the sidewalls 28 and base 29 of the trench after the trench is formed.

Following this, polysilicon 52 is deposited over the whole of the first major surface. The polysilicon 52 is then doped using diffusion from a $POCl_3$ source, to give the structure shown in FIG. 1b.

An etch back is then performed to remove the doped polysilicon 52 from the first major surface, leaving only a plug 26 at the base 29 of the trench. This results in the structure of FIG. 1c.

A low temperature wet oxidation process is then performed at 700° C. to 800° C. to oxidize the polysilicon plug to form an oxide plug 30 at the base of the trench. The nitride liner 50 prevents oxide from being formed on the side wall 28 of the trench. The oxide plug 30 at the bottom of the trench can be thick since the increased ease of oxidation of doped polysilicon allows a significant thickness of oxide to be formed in a reasonable time frame.

Next, the nitride liner 50 and thermal oxide 32 are etched away, in the region above the plug 30, and thermal oxidation carried out to result in a gate oxide 12 on the side walls above the plug 30. In an alternative approach, the thermal oxide 32 is not etched away but used itself as the gate oxide.

Figure 1D:
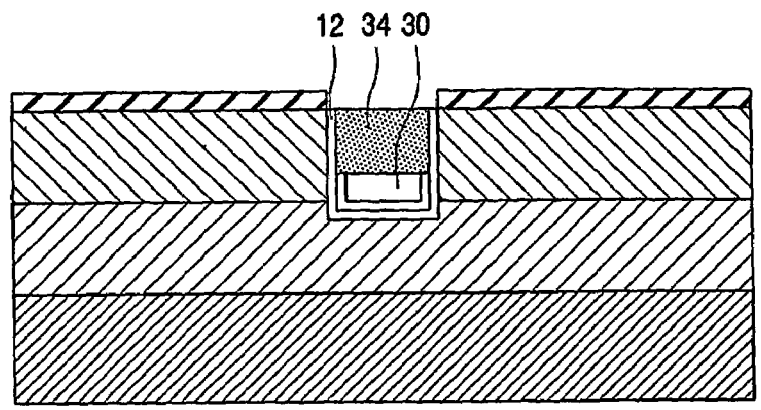

The next step is to fill the trench with polysilicon 34 acting as a gate, giving rise to the structure shown in FIG. 1d.

Figure 1E:
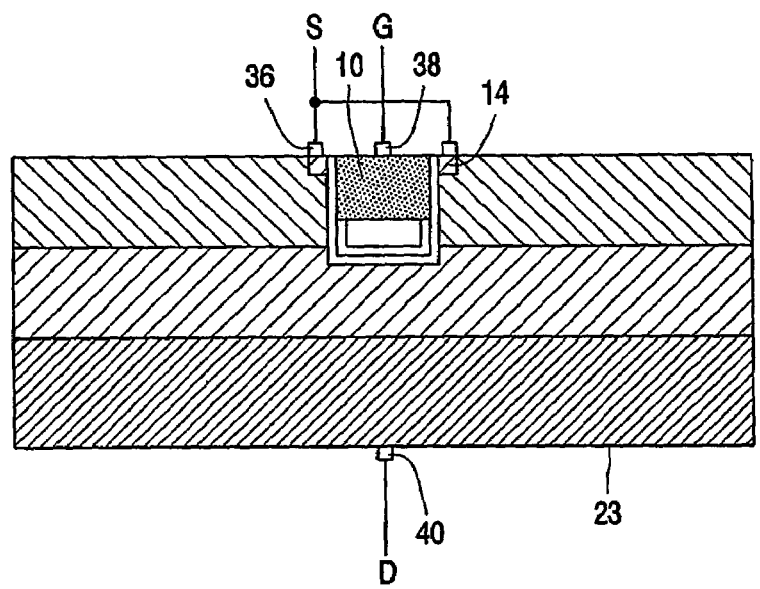

The remainder of the processing can be carried out in a conventional manner, as is well known to the man skilled in the art, to result in a device schematically illustrated in FIG. 1e. A source diffusion 14 is implanted at the first major surface at the lateral edges of the trench.

Source 36, gate 38 and drain 40 contacts are formed. They are schematically illustrated in FIG. 1e, the drain contact 40 being in this example a back contact on the second major surface 23. The source contact 36 contacts the n+ source diffusion 14.

The semiconductor is then packaged and contacted to form the finished semiconductor device as is known.

This process provides a ready means of manufacturing a trench MOSFET with a thick plug at the bottom of the trench to reduce capacitance between the gate 10 and the drain 2.

From reading the present disclosure, other variations and modifications will be apparent to persons skilled in the art. Such variations and modifications may involve equivalent and other features which are already known in the design, manufacture and use of trench semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

For example, in the embodiment described the source diffusion 14 is formed after the trench 8. However, as the skilled person will realise, it is also possible to form the source diffusion 14 and then etch the trench through the source diffusion. Other variations in trench etch manufacturing will be known to those skilled in the art and such variations may also be used.

The skilled person will realize that the invention may be used in a variety of different semiconductors structures. For example, although the epilayer 4 has been described as an n-epilayer, the body layer 6 as a p-type layer, and the source diffusion 14 as an n-doped region, any or all of these layers may be either p- or n type. A drift region, i.e. a low doped part of the drain epilayer 4 may be used, as is known. Other layers, diffusions and contacts may be included if required. The device may be p- or n-type.

The invention claimed is:

1. A method of manufacturing a trench gate semiconductor device comprising the steps of:
   providing a silicon device body having a first major surface, the silicon device body having a drain region of a first conductivity type and a body region over the drain region;
   forming a trench extending downwards into the silicon device body from the first major surface, the trench having sidewalls and a base;
   depositing a nitride liner within the trench to protect the sidewalls;
   forming a polysilicon plug at the base of the trench;
   thermally oxidising the device to oxidise the polysilicon at the bottom of the trench to form an oxide plug at the base of the trench; and
   depositing conductive material within the trench to form a gate.

2. A method according to claim 1 wherein the step of forming a polysilicon plug at the base of the trench forms a doped polysilicon plug at the base of the trench.

3. A method according to claim 2 wherein the step of depositing a doped polysilicon plug at the base of the trench includes depositing polysilicon over the first major surface including the trench and then etching back the doped polysilicon to remove the doped polysilicon from the first major surface leaving the polysilicon at the base of the trench.

4. A method according to claim 2 wherein the step of depositing doped polysilicon includes depositing undoped polysilicon and then carrying out a diffusion process to dope the undoped polysilicon.

5. A method according to claim 1 further comprising the steps of:
   thermally oxidising the side wall of the trench to form an oxide layer before depositing the nitride liner over the oxide layer;
   etching away the nitride liner and the oxide layer after oxidising the doped polysilicon; and
   thermally oxidising the sidewalls to form a thermal oxide gate insulator before depositing conductive material within the trench to form a gate.

6. A method according to claim 1 wherein the step of forming the trench includes providing a mask on the first major surface defining an opening and etching through the opening a trench extending downwards from the first major surface.

7. A method according to claim 6 wherein the mask is an oxide hard mask.

8. A method according to claim 1 wherein the step of depositing conductive material to form a gate includes filling the trench with polysilicon to form a gate.

9. A method according to claim 1 further comprising forming a source implant of first conductivity type at the first major surface adjacent to the trench and forming source, gate and drain electrodes attached to the source implant, the gate and the drain region respectively to complete the trench gate semiconductor device.

10. A trench MOSFET comprising:
   a drain region of first conductivity type;
   a body region over the drain region;
   a trench extending from a first major surface through the body region;
   source regions laterally adjacent to the trench at the first major surface;
   thermal gate oxide on the side walls of the trench;
   a gate electrode in the trench insulated from the body region by the gate oxide;
   characterised by a thick oxide plug formed only of thermally oxidised doped polysilicon at the base of the trench extending into the drain region.

\* \* \* \* \*